United States Patent [19]

Zaremba

[11] Patent Number: 4,864,300
[45] Date of Patent: Sep. 5, 1989

[54] ROTATING HIGH-RESOLUTION SHAFT ENCODER UTILIZING CAPACITIVE SENSING

[75] Inventor: Jerzy G. Zaremba, Rolling Hills Estates, Calif.

[73] Assignee: TRW Inc., Redondo Beach, Calif.

[21] Appl. No.: 64,977

[22] Filed: Jun. 18, 1987

[51] Int. Cl.$^4$ ............................................. H03M 1/48
[52] U.S. Cl. ....................................... 341/6; 318/254; 341/15; 341/16; 310/90.5; 310/266
[58] Field of Search ........................ 340/347 P, 347 M; 318/254; 310/90.5, 266; 341/6

[56] References Cited

U.S. PATENT DOCUMENTS

| | | | |
|---|---|---|---|
| 2,901,170 | 8/1959 | Poole | 340/347 P X |
| 4,463,276 | 7/1984 | Nakamura | 310/266 |
| 4,686,404 | 8/1987 | Nakazeki et al. | 310/90.5 |
| 4,720,698 | 1/1988 | Brooke et al. | 340/347 P |

Primary Examiner—William M. Shoop, Jr.
Assistant Examiner—Gary J. Romano
Attorney, Agent, or Firm—James M. Steinberger; Sol L. Goldstein

[57] ABSTRACT

A high-resolution shaft encoder and a related encoding method for accurately measuring angular position and velocity of rotating shafts. The high-resolution shaft encoder includes an annular-shaped actuator ring that rotates at high speed, a shaft centered within the actuator ring, and an encoder housing. The shaft encoder generates measurements of shaft position $\theta_p$ and velocity $\omega_p$, with respect to the encoder housing, from measurements of three time intervals $t_p$, $t_r$ and $\Delta t$. These time interval measurements are computed from the output of a sensor element positioned on the shaft and a sensor element positioned on the encoder housing, both of which respond to an input actuation element positioned on the rotating actuator ring.

47 Claims, 12 Drawing Sheets

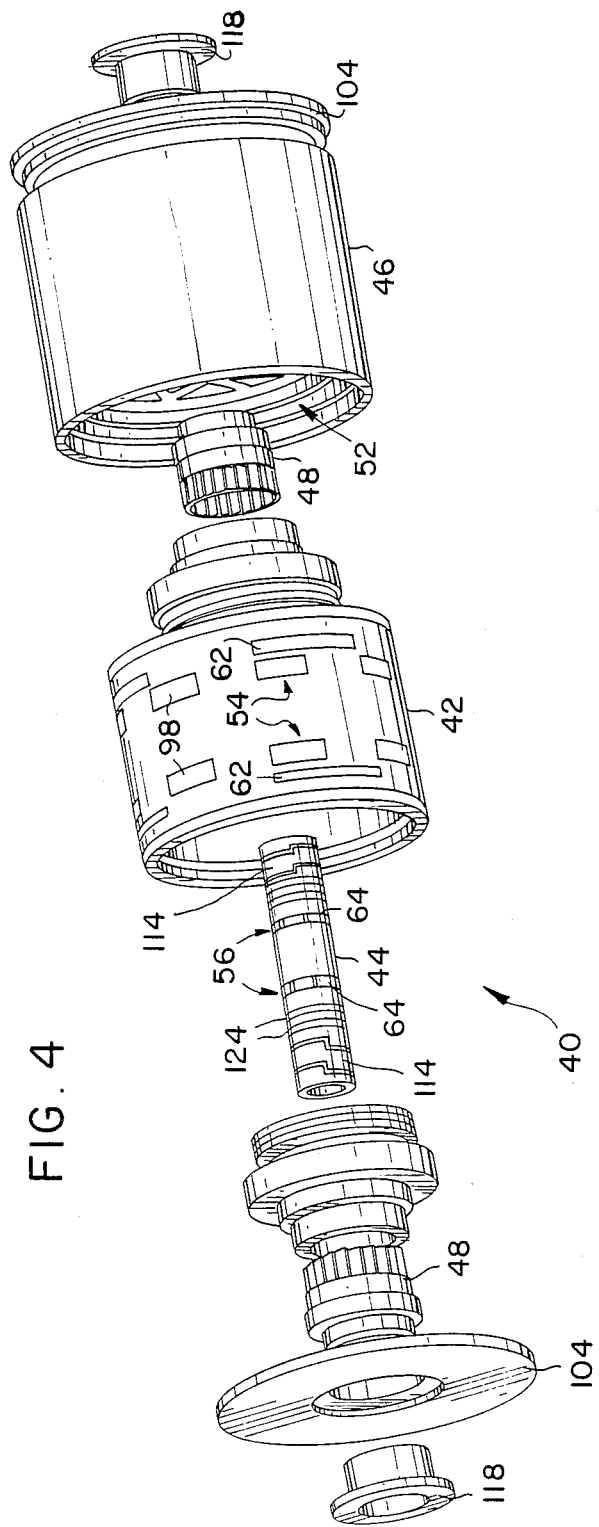

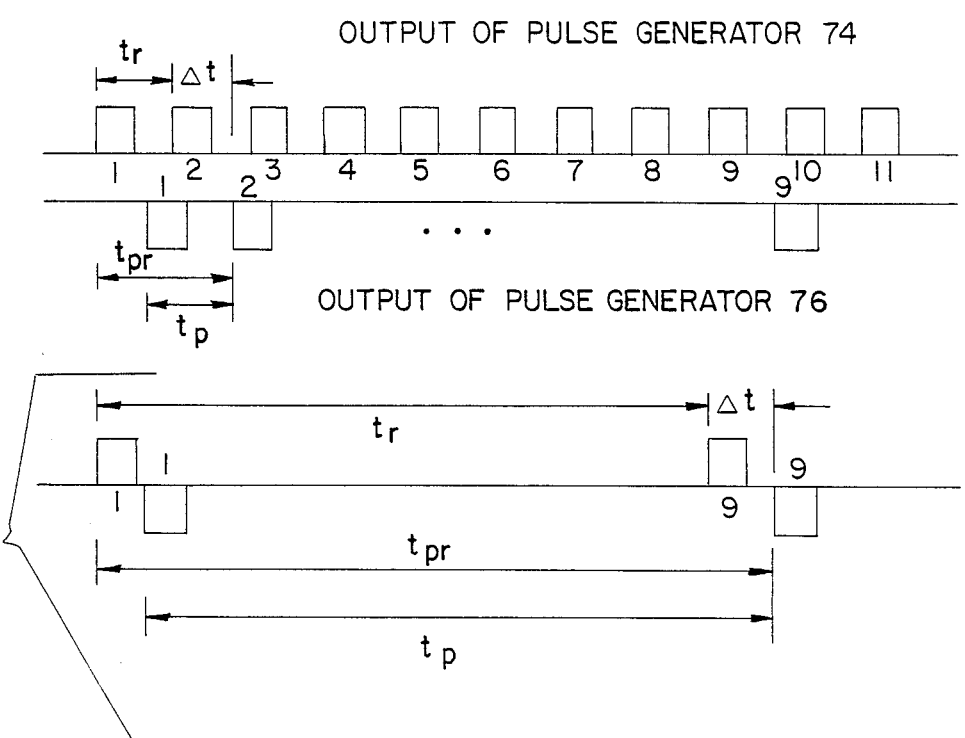

ROTATING HIGH-RESOLUTION SHAFT ENCODER UTILIZING CAPACITIVE SENSING

BACKGROUND OF THE INVENTION

This invention relates generally to transducers for measuring angular position and velocity of rotating shafts and, more particularly, to high-resolution shaft encoders that are used for precision pointing and tracking of satellite payloads.

Precision pointing and tracking of satellite payloads, including such present-day and future payloads as narrow-beam communication systems, surveillance packages and space defense systems, requires highly accurate measurements of payload angular position and velocity. One technique for measuring angular position and velocity of a satellite payload involves mounting inertial elements directly on the payload. Although this technique is frequently used for larger payloads, smaller payloads generally cannot accommodate the weight and bulk of an inertial measurement package.

Another technique for measuring angular position and velocity of a satellite payload involves mounting some type of transducer on or near the payload shaft. Conventional transducers utilized for this purpose include potentiometers, resolvers and encoders. Potentiometers and resolvers generally do not provide position and velocity measurements with sufficient accuracy for precision pointing and tracking of satellite payloads. Encoders of the contacting type, which make some physical contact with the payload shaft, are generally incorporated into ball-bearing-supported gimbal frames. Unfortunately, ball-bearing-supported gimbal frames can cause undesirable friction torques on the payload shaft. In addition, contacting type encoders rarely provide accurate velocity measurements near zero velocity because of stiction between the gimbal frames and the payload shaft.

Noncontacting type encoders, such as magnetic and optical encoders, which make no physical contact with the payload shaft, generally provide reliable angle measurements approaching one to two arc-seconds. More accurate angular measurements require encoders that are prohibitively heavy, large and costly for precision pointing and tracking of satellite payloads. In many cases, the weight of the encoder exceeds that of the payload. Furthermore, conventional noncontacting type encoders do not provide accurate velocity measurements near zero velocity because the accuracy of the velocity measurement is dependent on the velocity of the payload shaft, which is frequently very low. Accordingly, there has been a need for an improved shaft encoder that is small, lightweight and low cost and, in addition, accurately measures angular position and velocity, especially at low angular velocities. The present invention clearly fulfills this need.

SUMMARY OF THE INVENTION

The present invention resides in a high-resolution shaft encoder and a related encoding method for accurately measuring angular position and velocity of rotating shafts. The high-resolution shaft encoder includes an annular-shaped actuator ring that rotates at high speed, a shaft, such as a payload shaft, centered within the actuator ring, and an encoder housing. The shaft encoder generates measurements of shaft position $\theta_p$ and velocity $\omega_p$, with respect to the encoder housing, from measurements of three time intervals $t_p$, $t_r$ and $\Delta t$. These time interval measurements are computed from the output of a sensor element positioned on the payload shaft and a sensor element positioned on the encoder housing, both of which respond to an input actuation element positioned on the rotating actuator ring.

Time interval $t_r$, which is the period of time for the actuator ring to rotate a predetermined angular displacement $\gamma_r$ with respect to the encoder housing, is the time interval between successive outputs of the housing sensor element. Time interval $t_p$, which is the period of time for the actuator ring to rotate a predetermined angular displacement $\gamma_p$ with respect to the payload shaft, is the time interval between successive outputs of the shaft sensor element. These two predetermined angular displacements are preferably equal and are each one revolution of the actuator ring, or $2\pi$ radians. Time interval $\Delta t$, which is the period of time for the actuator ring to rotate an angular displacement $\theta_p$, is the time interval between an output of the housing sensor element and an output of the shaft sensor element.

The angular displacement or angular position $\theta_p$ of the payload shaft, with respect to the encoder housing, is defined by the equation $$\theta_p = \Delta t \cdot \gamma_r / t_r$$

where $\gamma_r/t_r$ is the angular velocity $\omega_a$ of the actuator ring. The angular velocity $\omega_p$ of the payload shaft with respect to the encoder housing is defined by the equation $$\omega_p = \gamma_r \cdot [(1/t_r) - (1/t_p)]$$

The shaft encoder of the present invention provides greatly improved resolutions of angular position and velocity when compared with conventional shaft encoders. The position resolution $\Delta\theta_p$ provided by the shaft encoder of the present invention is dependent on the rotational velocity $\omega_a$ of the actuator ring and the time measuring capability of the output sensor elements. The resolution $\Delta\theta_p$ can be expressed by the equation $$\Delta\theta_p = \omega_a \cdot t_{min}$$

where $t_{min}$ is the minimum time measuring capability of the output sensor elements. As an example, if the rotational velocity $\omega_a$ of the actuator ring is 4800 rpm and the minimum time measuring capability $t_{min}$ of the sensor elements is $10^{-9}$ seconds, the resolution $\Delta\theta_p$ provided by the shaft encoder of the present invention is approximately 0.10 arc-sec.

The velocity resolution $\Delta\omega_p$ provided by the shaft encoder of the present invention can be expressed by the equation $$\Delta\omega_p = 2\pi t_{min}[(1/t_r)^2 - (1/t_p)^2]$$

As an example, if the minimum time measuring capability of the sensor elements is $10^{-9}$ seconds and the time interval measurements $t_r$ and $t_p$ are 0.01225 sec and 0.0120 sec, respectively, the resolution $\Delta\omega_p$ is approximately 0.36 arc-sec/sec.

In a presently preferred embodiment of the invention, the time interval measurements $t_p$, $t_r$ and $\Delta t$ are generated using capacitive sensor elements positioned on the payload shaft and the encoder housing, which interact with insulator elements positioned on an otherwise electrically charged actuator ring. Specifically, a sensor element pattern on the inner annular surface of he encoder housing interacts with an insulator element pattern on the outer annular surface of the actuator ring to generate a four-cycle per revolution triangular waveform that is used for computing time interval measurement $t_r$. A sensor element pattern on the outer surface of the payload shaft interacts with an insulator element pattern on the inner annular surface of the actuator ring to generate a four-cycle per revolution triangular waveform that is used for computing time interval measurement $t_p$. Both triangular waveforms are used for computing time interval measurement $\Delta t$.

It will be appreciated from the foregoing that the present invention provides a high-resolution encoder and a related method for accurately measuring angular position and velocity of rotating shafts. Because of the rotating actuator ring, the encoder provides highly accurate velocity measurements even at low angular velocities. Furthermore, the position and velocity resolutions of the encoder can be easily varied according to the particular static and dynamic requirements of the payload by adjusting the angular velocity of the actuator ring. In addition, the shaft encoder is small, lightweight and low cost. Other features and advantages of the present invention will become apparent from the following more detailed description, taken in conjunction with the accompanying drawings, which illustrate, by way of example, the principles of the invention.

BRIEF DESCRIPTION OF THE DRAWINGS

FIG. 4 is an exploded perspective view of the high-resolution shaft encoder, illustrating an actuator ring, an encoder housing and a payload shaft;

FIGS. 19a–19b are amplitude-vs-time graphs showing a series of gate pulses and the three time intervals.

DETAILED DESCRIPTION OF THE PREFERRED EMBODIMENTS

Figure 1:
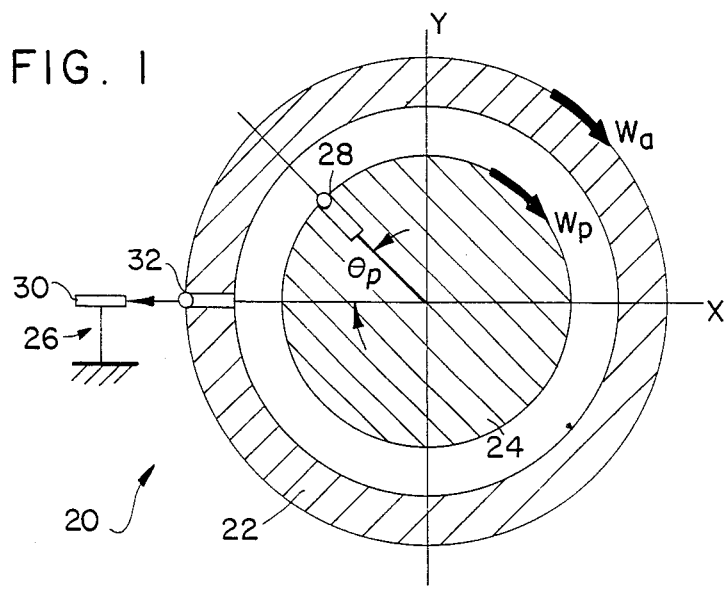
FIG. 1 is a simplified sectional view of a high-resolution shaft encoder according to the present invention.

As shown in the drawings for purposes of illustration, the present invention is embodied in a high-resolution shaft encoder and a related encoding method for accurately measuring angular position and velocity of rotating shafts. Precision pointing and tracking of satellite payloads requires highly accurate measurements of payload angular position and velocity. One technique for measuring angular position and velocity of a satellite payload involves mounting inertial elements directly on the payload. Although this technique is frequently used for larger payloads, smaller payloads generally cannot accommodate the weight and bulk of an inertial measurement package. Another technique for measuring angular position and velocity of a satellite payload involves mounting some type of transducer on or near the payload shaft. However, conventional transducers utilized for this purpose do not provide position and velocity measurements with sufficient accuracy for precision pointing and tracking of satellite payloads.

Figure 2:
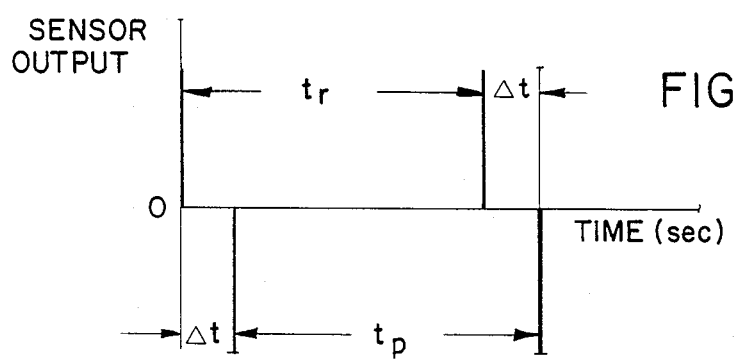
FIG. 2 is a voltage-vs-time graph illustrating sensor outputs from the shaft encoder, including three time intervals between these sensor outputs that must be measured to compute angular position and velocity.

FIG. 1 illustrates conceptually a high-resolution shaft encoder 20 in accordance with the present invention. Shaft encoder 20 includes an annular-shaped actuator ring 22 that rotates at high speed, a payload shaft 24 centered within actuator ring 22, and a stationary reference frame 26. Shaft encoder 20 generates measurements of shaft position $\theta_p$ and velocity $\omega_p$, with respect to reference frame 26, from measurements of three time intervals $t_p$, $t_r$ and $\Delta t$, as shown in FIG. 2. These time interval measurements are computed from the outputs of sensor elements 28, 30, which are positioned on payload shaft 24 and stationary reference frame 26, respectively. The two sensor elements 28, 30 respond to an input actuation element 32 positioned on the rotating actuator ring 22.

As shown in FIGS. 1 and 2, time interval $t_r$, which is the period of time for actuator ring 22 to rotate a predetermined angular displacement $t_r$, with respect to reference frame 26, is the time interval between successive outputs of sensor element 30. Time interval $t_p$, which is the period of time for actuator ring 22 to rotate a predetermined angular displacement $\gamma_p$ with respect to payload shaft 24, is the time interval between successive outputs of sensor element 28. These two predetermined angular displacements are preferably equal and are each one revolution of the actuator ring, or $2\pi$ radians. Time interval $\Delta t$, which is the period of time for actuator ring 22 to rotate an angular displacement $\theta_p$, is the time interval between an output of sensor element 30 and an output of sensor element 28. The angular displacement or angular position $\theta_p$ of payload shaft 24 with respect to reference frame 26 is defined by the equation $$\theta_p = \Delta t * \gamma_r / t_r$$

where $\gamma_r/t_r$ is the angular velocity $\omega_a$ of actuator ring 22.

The angular velocity $\omega_p$ of payload shaft 24 with respect to reference frame 26 is defined by the equation $$\omega_p = (\gamma_r/t_r) - (\gamma_p/t_p)$$

Because the predetermined angular displacements $\gamma_r$ and $\gamma_p$ are equal, the equation can be simplified to $$\omega_p = \gamma_r * [(1/t_r) - (1/t_p)]$$

The shaft encoder 20 of the present invention provides greatly improved resolutions of angular position and velocity when compared with conventional shaft encoders. The position resolution $\Delta\theta_p$ provided by the shaft encoder of the present invention is dependent on the rotational velocity $\omega_a$ of actuator ring 22 and the time measuring capability of the output sensor elements 28, 30. The resolution $\Delta\theta_p$ can be expressed by the equation $$\Delta\theta_p = \omega_a * t_{min}$$

where $t_{min}$ is the minimum time measuring capability of the output sensor elements. As an example, if the rotational velocity $\omega_a$ of actuator ring 22 is 4800 rpm and the minimum time measuring capability $t_{min}$ of the sensor elements is $10^{-9}$ seconds, the resolution $\Delta\theta_p$ provided by the shaft encoder of the present invention is approximately 0.10 arc-sec.

The velocity resolution $\Delta\omega_p$ provided by the shaft encoder of the present invention can be expressed by the equation $$\Delta\omega_p = 2\pi t_{min}[(1/t_r)^2 - (1/t_p)^2]$$

As an example, if the minimum time measuring capability of the sensor elements is $10^{-9}$ seconds and the time interval measurements $t_r$ and $t_p$ are 0.01225 sec and 0.0120 sec, respectively, the resolution $\Delta\omega_p$ is approximately 0.36 arc-sec/sec. Time interval measurements of 0.01225 and 0.0120 sec result from an angular velocity $\omega_p$ of approximately 100 rpm.

Figure 3:
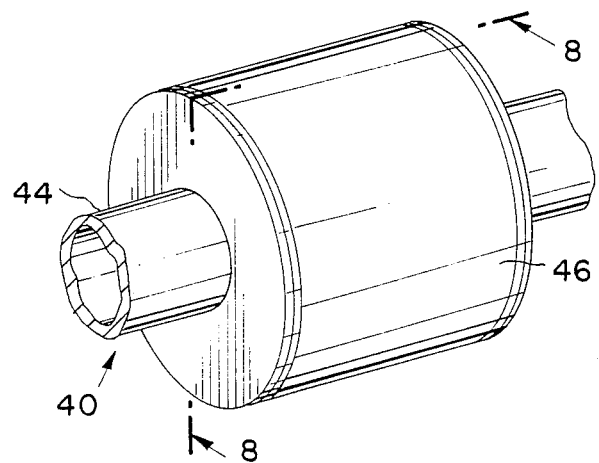
FIG. 3 is a perspective view of the high-resolution shaft encoder of the present invention.
Figure 6:
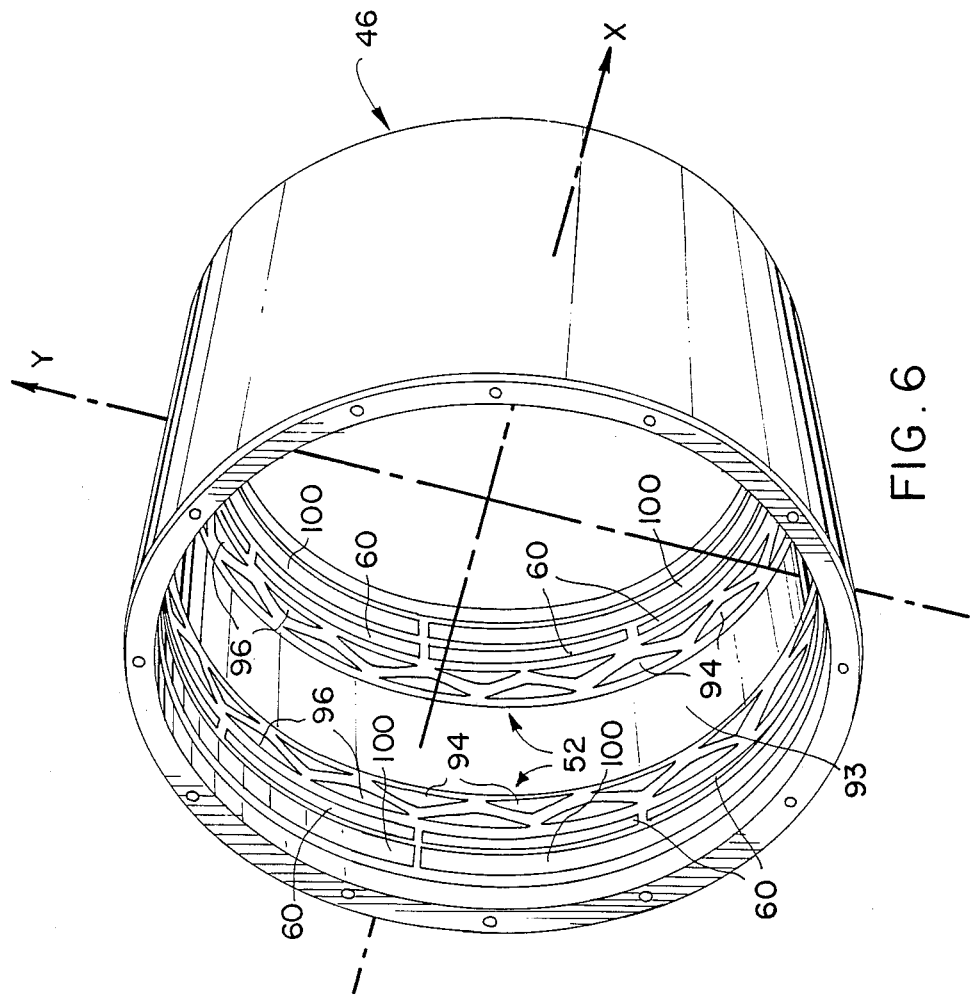
FIG. 6 is an enlarged perspective view of the encoder housing.
Figure 5:
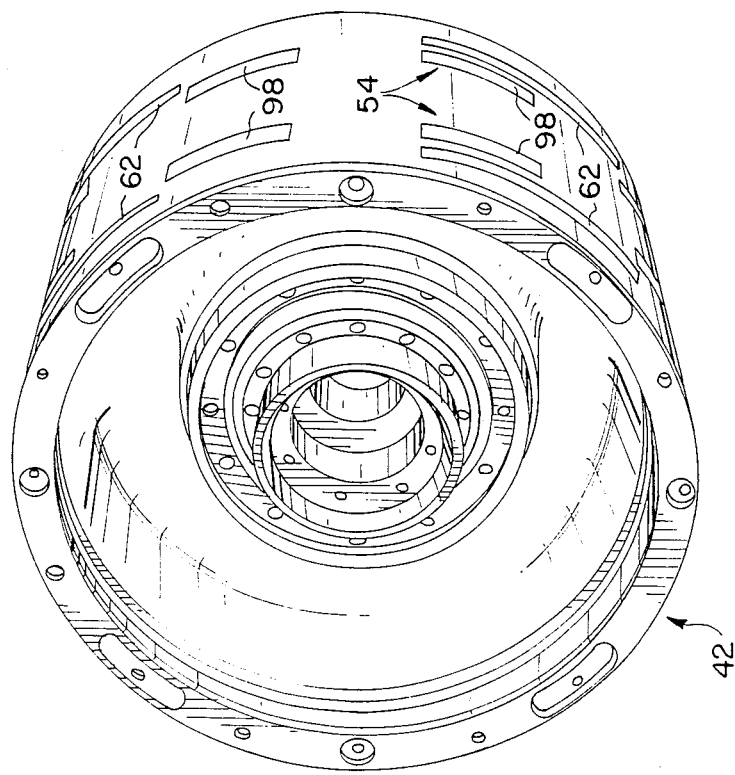
FIG. 5 is an enlarged perspective view of the actuator ring.
Figure 7:
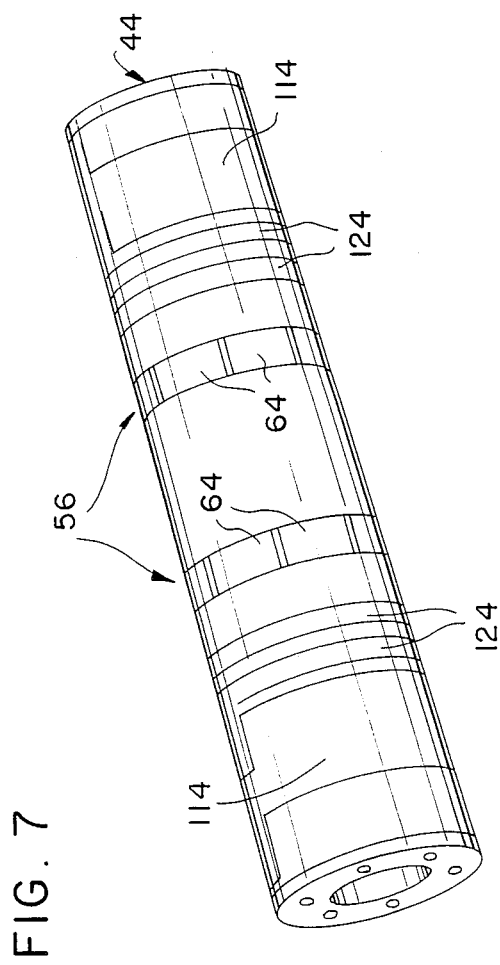
FIG. 7 is an enlarged perspective view of the payload shaft.

As shown in FIGS. 3-4, a high-resolution shaft encoder 40 according to the present invention includes an annular-shaped actuator ring 42 that rotates at high speed, a payload shaft 44 centered within the rotating actuator ring, and an encoder housing 46 that serves as the stationary reference frame 26. A DC motor incorporated into the encoder rotates the actuator ring 42 at approximately 4800 rpm. The DC motor includes the actuator ring 42, which is the rotor of the DC motor, and a pair of ironless stator windings 48 positioned on either side of the actuator ring. A pair of magnetic bearings 50, also positioned on either side of the actuator ring and shown in FIGS. 8 and 15, magnetically suspend actuator ring 42 as it rotates.

Time interval measurements $t_p$, $t_r$ and $\Delta t$ are generated using capacitive sensor elements positioned on the outer surface of payload shaft 44 and the inner annular surface of encoder housing 46. These sensor elements interact with insulator elements positioned on the outer and inner annular surfaces of actuator ring 42, which is otherwise electrically charged by a high frequency voltage source. Specifically, a sensor element pattern 52 on the inner annular surface of encoder housing 46, shown in detail in FIG. 9, interacts with an insulator element pattern 54 on the outer annular surface of actuator ring 42, shown in detail in FIG. 10, to generate triangular waveforms that are used for computing time interval measurement $t_r$. A sensor element pattern 56 on the outer surface of payload shaft 44, shown in detail in FIG. 11, interacts with an insulator element pattern 58 on the inner annular surface of actuator ring 42, shown in detail in FIG. 12, to generate triangular waveforms that are used for computing time interval measurement $t_p$. Both triangular waveforms are used for computing time interval measurement $\Delta t$. These sensor and insulator element patterns also generate quadrature sinusoidal commutation signals for energizing the stator windings 48 of the DC motor and provide measurements of X-direction and Y-direction displacements of actuator ring 42 with respect to encoder housing 46 for active radial control of the magnetic bearings 50.

Figure 9:
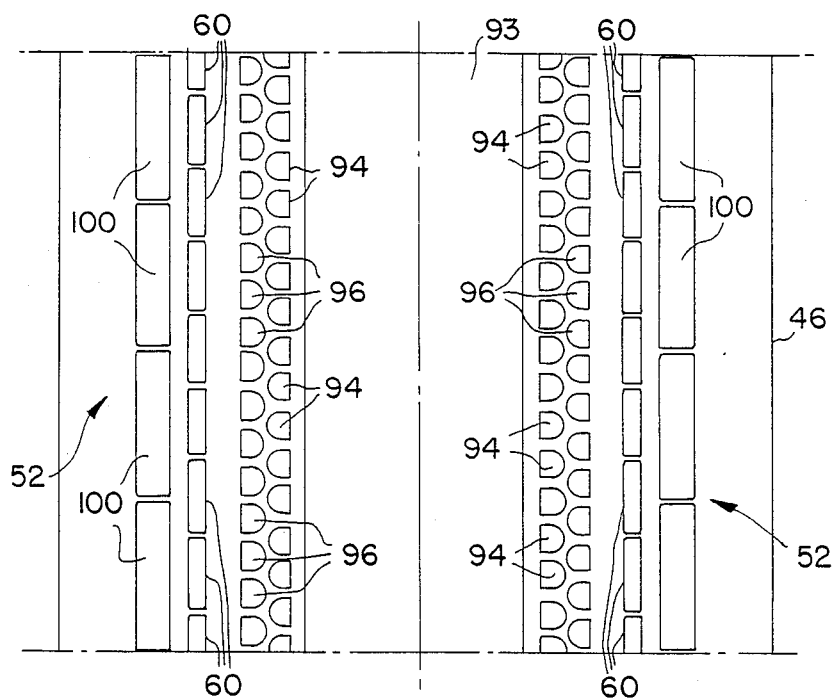
FIG. 9 illustrates a capacitive sensor element pattern on the inner annular surface of the encoder housing.
Figure 10:
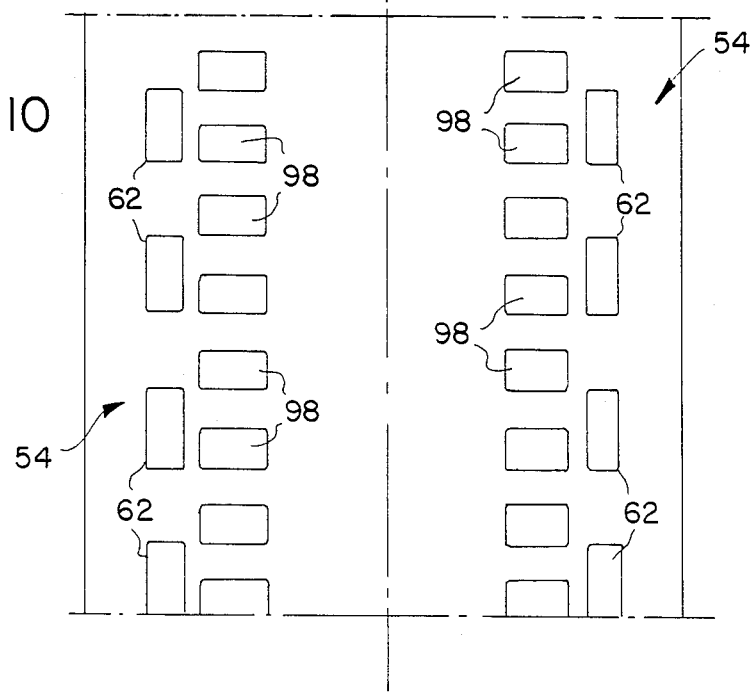
FIG. 10 illustrates an insulator element pattern on the outer annular surface of the actuator ring.
Figure 13:
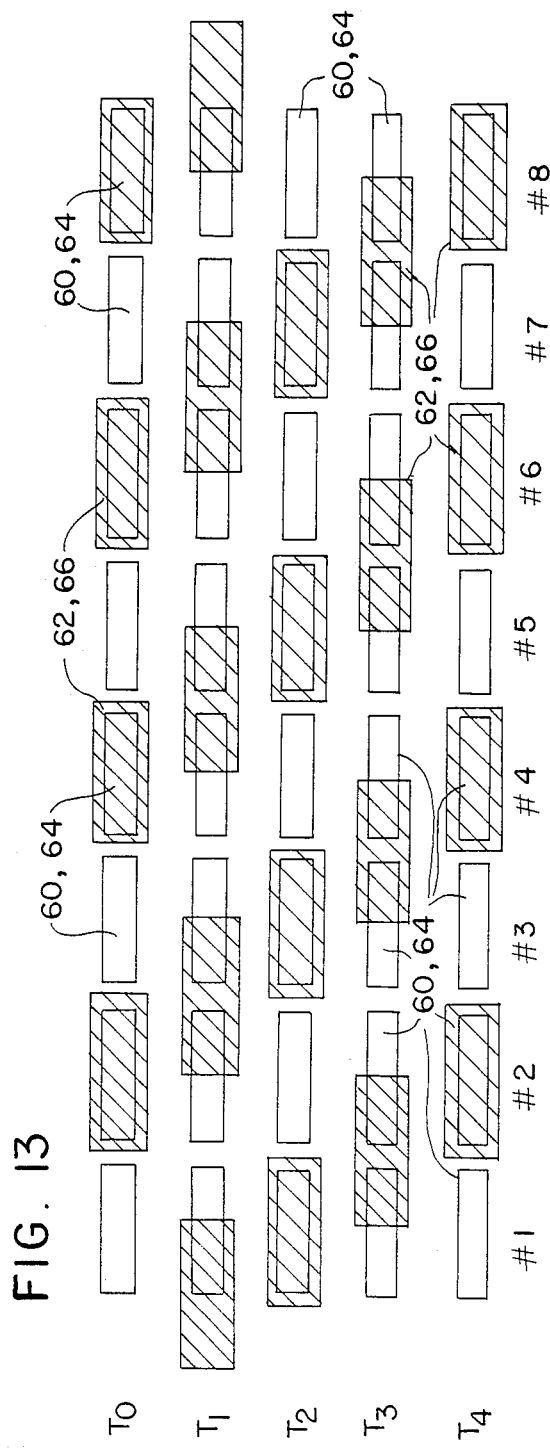
FIG. 13 illustrates diagrammatically the interactions of the insulating element patterns with the sensor element patterns as the actuator ring rotates.
Figure 14:
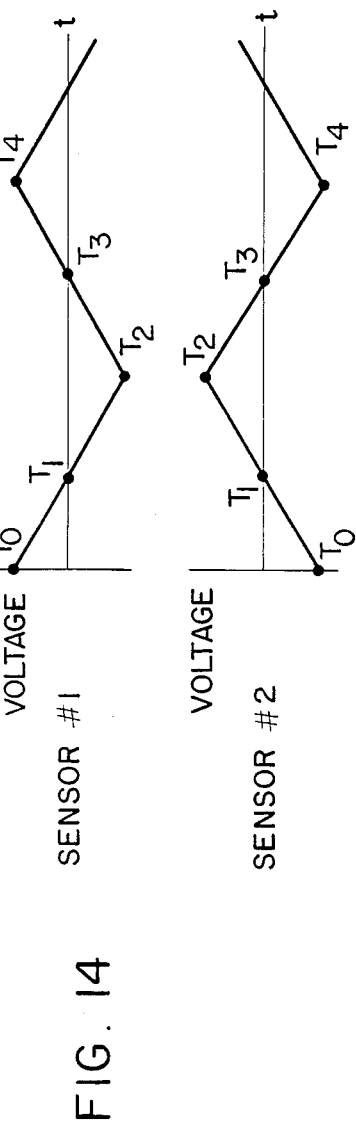
FIG. 14 is a voltage-vs-time graph showing the triangular waveforms generated by the sensor elements.

The triangular waveforms used for computing time interval measurement $t_r$ are generated by the interaction of a left and right set of sensor elements 60 in sensor pattern 52 with a left and right set of insulator elements 62 in insulator pattern 54, respectively. The left and right sets of sensor and insulator elements 60, 62 are positioned symmetrically on either side of the X-Y plane of the sensor and insulator patterns 52, 54, respectively. As shown in FIG. 9, each set of sensor elements 60 includes eight rectangular conductor elements spaced around the inner annular surface of encoder housing 46 at 45 degree intervals, with each element spanning slightly less than 45 degrees of the annular surface. As shown in FIG. 10, each set of insulator elements 62 includes four rectangular insulator elements spaced around the outer annular surface of actuator ring 42 at 90 degree intervals, with each element spanning 45 degrees of the annular surface. As actuator ring 42 rotates, insulator elements 62 cause sensor elements 60 to be alternately exposed to and insulated from the electrically-charged actuator ring 42. As shown in FIGS. 13-14, this causes a four-cycle per revolution triangular waveform to be output by each sensor element 60.

Figure 18:
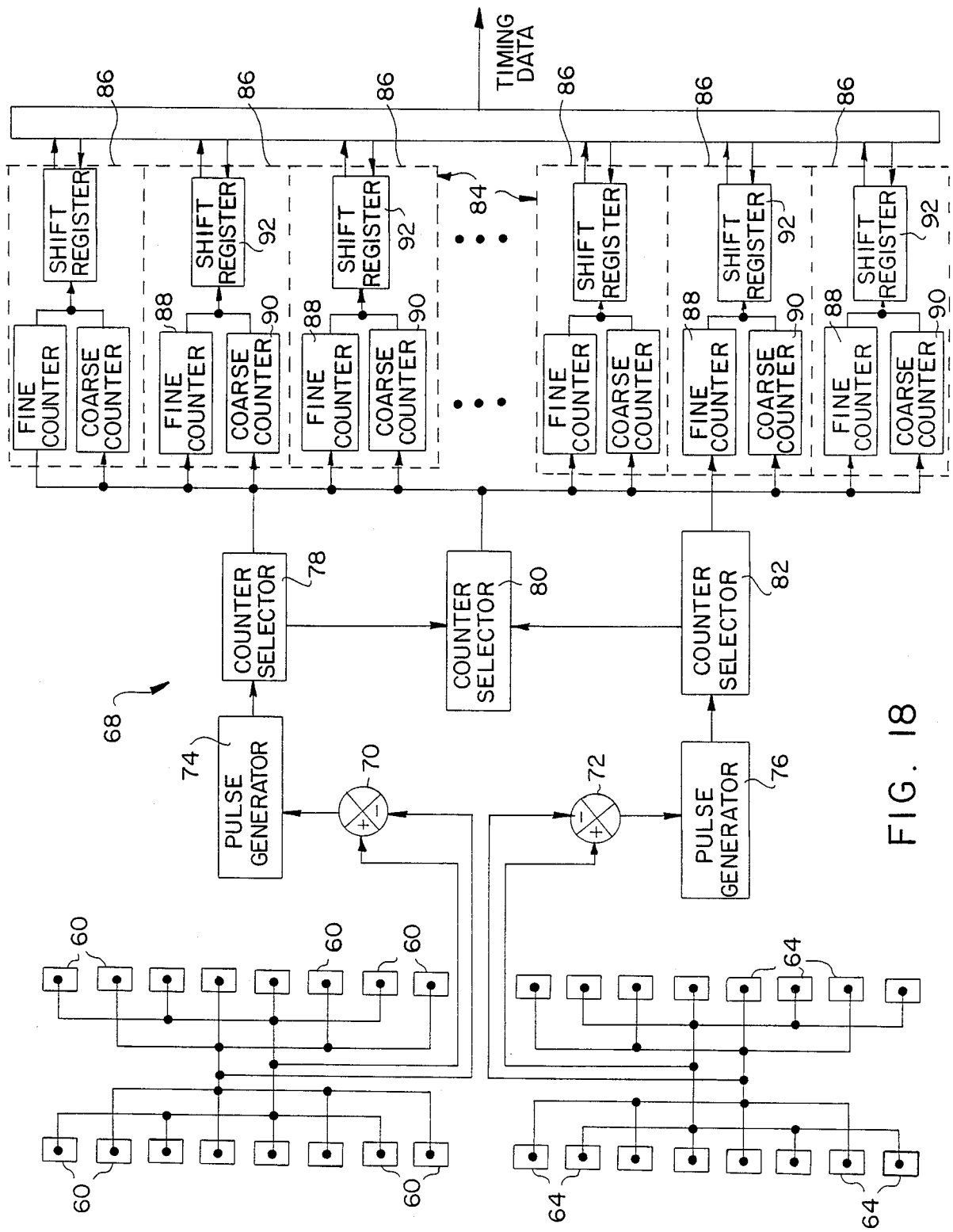
FIG. 18 is a block diagram of a time measuring circuit for generating the three time interval measurements.

As shown in FIG. 14, the triangular waveforms output by every other sensor element 60 are in phase, while the waveforms output by adjacent sensor elements 60 are 180 degrees out of phase. The in-phase outputs of each set of sensor elements are electrically connected, as shown in FIG. 18, to reduce the effects of small radial movements of the payload shaft. The in-phase outputs of the left and right sets of sensor elements 60 are also electrically connected to reduce the effects of small angular movements of the payload shaft. As a result, the sixteen left and right sensor elements 60 generate two triangular waveforms that are 180 degrees out of phase.

Figure 11:
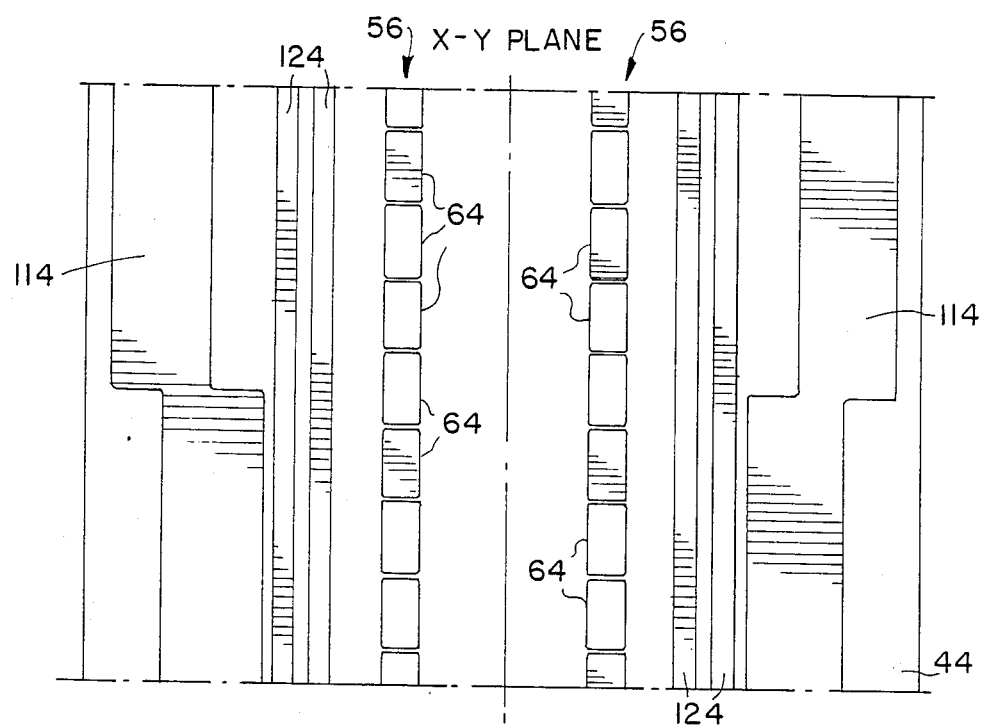
FIG. 11 illustrates a capacitive sensor element pattern on the outer surface of the payload shaft.
Figure 12:
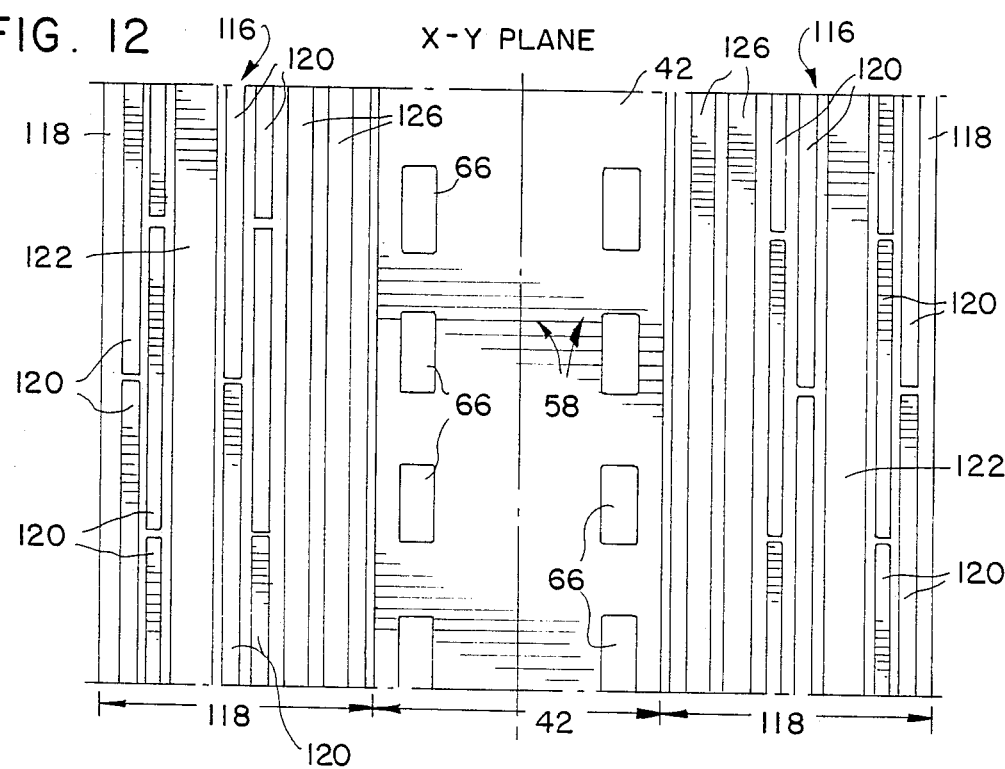
FIG. 12 illustrates an insulator element pattern on the inner annular surface of the actuator ring.

The triangular waveforms used for computing time interval measurement $t_p$ are generated by the interaction of a left and right set of sensor elements 64 in sensor pattern 56 with a left and right set of insulator elements 66 in insulator pattern 58, respectively. The left and right sets of sensor and insulator elements 64, 66 are arranged in the same manner as the left and right sets of sensor and insulator elements 60, 62. As shown in FIG. 11, each set of sensor elements 64 includes eight rectangular conductor elements spaced around the outer surface of payload shaft 44 at 45 degree intervals, with each element spanning slightly less than 45 degrees of the outer surface. As shown in FIG. 12, each set of insulator elements 66 includes four rectangular insulator elements spaced around the inner annular surface of actuator ring 42 at 90 degree intervals, with each element spanning 45 degrees of the annular surface. As with sensor and insulator elements 60, 62, insulator elements 66 cause sensor elements 64 to be alternately exposed to and insulated from the electrically-charged, rotating actuator ring 42. As shown in FIGS. 13-14, a four-cycle per revolution triangular waveform is output by each sensor element 64. In addition, as shown in FIG. 18, sensor elements 64 are electrically connected in the same manner as sensor elements 60. As a result, the sixteen left and right sensor elements 64 also generate two triangular waveforms that are 180 degrees out of phase.

The triangular waveforms output by the left and right sets of sensor elements 60, 64 are then applied to a time interval measurement circuit 68, as shown in FIG. 18. Time measurement circuit 68 converts the triangular waveforms into two series of gate pulses for measurement of the time intervals $t_p$, $t_r$ and $t_{pr}$, where time interval $t_{pr}$ is equal to $\Delta t + t_r$. Time measurement circuit 68 includes a pair of subtracters 70, 72, a pair of pulse generators 74, 76, three counter selectors 78, 80, 82, and sixteen time counting circuits 84. Subtracter 70 combines the two 180 degree out-of-phase triangular waveforms output by sensor elements 60, while subtracter 72 combines the two 180 degree out-of-phase triangular waveforms output by sensor elements 64. The out-of-phase waveforms are combined by subtracting since the waveforms are 180 degrees out of phase and, therefore, are inverses of each other. The triangular waveforms output by subtracters 70, 72 are then converted into gate pulses, as shown in FIG. 19a, by the pulse generators 74, 76, respectively. The pulse generators 74, 76 are preferably a pair of Schmitt triggers. The three counter selectors 78, 80, 82 then sequentially apply the gate pulses to the sixteen time counting circuits 84.

Measurements of the three time intervals $t_p$, $t_r$ and $t_{pr}$ can be taken either between adjacent gate pulses, as shown in FIG. 19a, or between gate pulses separated by one revolution of the actuator ring 42, as shown in FIG. 19b. When the time interval measurements are made between adjacent gate pulses, geometric and sensor errors are introduced into the time measurements at eight times per revolution of the actuator ring 42. To reduce these errors, continuous calibration of each of the sensor elements 60, 64 is required. When the time interval measurements are made between gate pulses separated by one revolution of the actuator ring, the same sensor elements 60, 64 are involved in each time interval measurement, thus eliminating geometric and sensor errors. The data rate from the sensor elements remains at 640 Hz ((4800 rpm/60 sec/min)*8 sensors) provided that time interval measurements are made for each gate pulse. This requires sixteen time counting circuits 84. Eight of the counting circuits 84 provide the eight time interval measurements for the even-numbered revolutions of actuator ring 42 and the other eight counting circuits 84 provide the eight time interval measurements for the odd-numbered revolutions of the actuator ring. Counting circuits 84 are required for the even- and odd-numbered revolutions of the actuator ring because each counting circuit requires slightly more than one revolution of the actuator ring to complete the counting process.

Each of the sixteen time counting circuits 84 includes three separate counters 86. The first counter 86 measures time interval $t_r$, the second counter 86 measures time interval $t_{pr}$, and the third counter 86 measures time interval $t_p$. For example, as shown in FIG. 19b, time interval $t_r$ is the period of time between a first or start gate pulse output by pulse generator 74 and a ninth or stop gate pulse output by the same pulse generator. Time interval $t_p$ is the period of time between a first or start gate pulse output by pulse generator 76 and a ninth or stop gate pulse output by the same pulse generator. Time interval $t_{pr}$ is the period of time between the first or start gate pulse output by pulse generator 74 and the ninth or stop gate pulse output by pulse generator 76.

As will be recalled, time interval $\Delta t$ is the period of time required for actuator ring 22 to rotate an angular displacement $\theta_p$. Time interval $t_{pr}$ is the period of time required for the actuator ring to rotate an angular displacement $\theta_p + 2\pi$. The angular position $\theta_p$ of payload shaft 44 with respect to encoder housing 46 is defined by the equation $$\theta_p = \gamma_r * (t_{pr} - t_r)/t_r$$

where $\gamma_r = 2\pi$ rads and $t_{pr} - t_r = \Delta t$. The angular velocity $\omega_p$ of the payload shaft with respect to the encoder housing is defined by the equation $$\omega_p = \gamma_r * [(1/t_r) - (1/t_p)]$$

Each of the counters 86 includes a fine-resolution counter 88, a coarse-resolution counter 90, and a shift register 92 for storing the outputs of the two counters 88, 90. In the presently preferred embodiment of the invention, the counters 88, 90 are clocked by a 10 MHz clock. The coarse-resolution counters 90 count the number of 10 MHz clock pulses that occur between the start gate pulse and the stop gate pulse, thus providing the 20 most significant bits of each 32 bit time interval measurement. The 20 most significant bits provide a position resolution of approximately 10 arc-seconds. Because the 10 MHz clock pulses are not synchronous with the start and stop gate pulses, an error of up to one clock period can occur between the start gate pulse and the first clock pulse counted by the coarse-resolution counter. Similarly, an error of up to one clock period can occur between the stop gate pulse and the last clock pulse counted by the coarse-resolution counter. The fine-resolution counters 88 measure these two time intervals, providing the 12 least significant bits of each 32 bit time interval measurement. The fine-resolution counters measure these short time intervals by scaling the duration of each time interval and then counting the number of 10 MHz clock pulses that occur during the scaled time interval. In the presently preferred embodiment of the invention, each time interval is scaled by charging a capacitor for a period of time equal to the time interval. The capacitor then discharges at a rate such that the discharge time is equal to the scaled time interval. During the discharge time period, the fine-resolution counter counts the number of 10 MHz clock pulses. In the presently preferred embodiment, the scaling factor is approximately 800, providing a shaft encoder with an angular resolution of 0.0250 arc-seconds (2* 10 arc-sec/800). In an alternatively preferred embodiment of the invention, a higher clock frequency can be used, thus eliminating the need for the fine-resolution counters altogether.

Sensor pattern 52 and insulator pattern 54, shown in FIGS. 9 and 10, also include sensor and insulator elements that generate quadrature sinusoidal commutation signals for energizing the stator windings 48 of the DC motor and provide measurements of X-direction and Y-direction displacements of actuator ring 42 with respect to encoder housing 46 for active radial active control of the magnetic bearings 50. At the center of sensor pattern 52, between the left and right sets of sensor elements, is a charge plate 93 for electrically charging actuator ring 42 with a high frequency 1 MHz) voltage source to operate the capacitive sensor elements.

The quadrature sinusoidal signals are generated by the interactions of a left and right set of sine-shaped sensor elements 94, 96 in sensor element pattern 52 with a left and right set of insulator elements 98 in insulator element pattern 54, respectively. As shown in FIG. 9, each set of sine-shaped sensor elements 94, 96 includes 32 sine-shaped conductor elements spaced around the inner annular surface of encoder housing 46 at 11.25 degree intervals, with each element spanning slightly less than 11.25 degrees of the annular surface. Sensor elements 94 and sensor elements 96 are offset from each other mechanically by 6.125 degrees to provide a 90 degree phase shift between the two outputs for the quadrature phase relationship. As shown in FIG. 10, each set of insulator elements 98 includes eight rectangular insulator elements spaced around the outer annular surface of actuator ring 42 at 45 degree intervals, with each element spanning 22.5 degrees of the annular surface. As actuator ring 42 rotates, an eight-cycle per revolution sinusoidal waveform is output by each sensor element 94, 96. The outputs of the sensor elements 94, 96 are combined in the same manner as the outputs of sensor elements 60, 66 to provide an eight-cycle per revolution quadrature sinusoidal waveform. This waveform is amplified and applied to the 32 stator windings 48 of the DC motor. The 32 energized stator windings 48 interact with eight magnets spaced around the inner annular surface of actuator ring 42 to provide an eight-pole, four-phase DC motor for rotating the actuator ring.

Measurements of the X-direction and Y-direction displacements of actuator ring 42 with respect to encoder housing 46, for active radial control of the magnetic bearings 50, are provided by a left and right set of proximity sensor elements 100 in sensor element pattern 52. As shown in FIG. 9, each set of proximity sensor elements 100 includes four rectangular conductor elements spaced around the inner annular surface of encoder housing 46 at 90 degree intervals, with each element spanning slightly less than 90 degrees of the annular surface. The proximity sensor elements 100 measure the relative displacements of actuator ring 42, with respect to encoder housing 46, along the X and Y directions. The X-direction and Y-direction displacement measurements are amplified and applied to the magnetic bearings 50.

Figure 8:
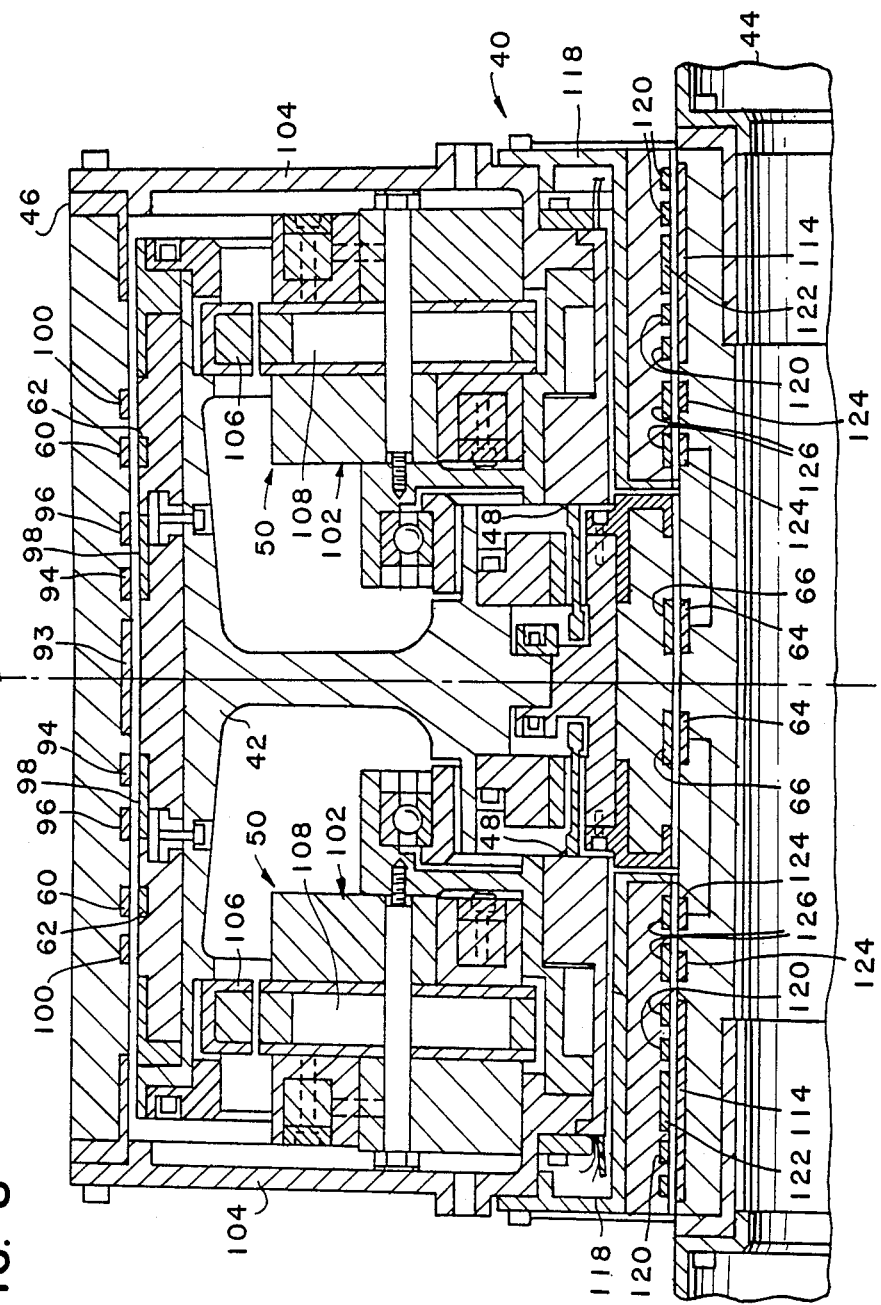
FIG. 8 is an enlarged, fragmented sectional view of the high-resolution shaft encoder taken along the line 8—8 of FIG. 3.
Figure 15:
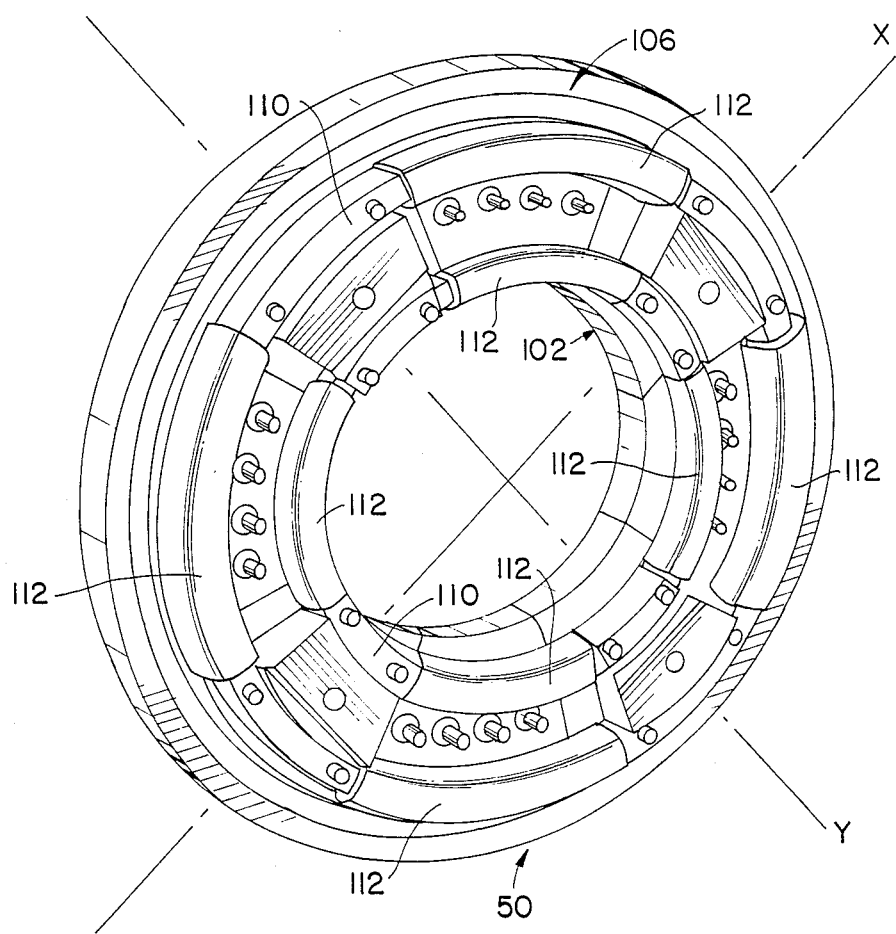
FIG. 15 is an enlarged perspective view of a magnetic bearing for magnetically suspending the actuator ring as it rotates.
Figure 16:
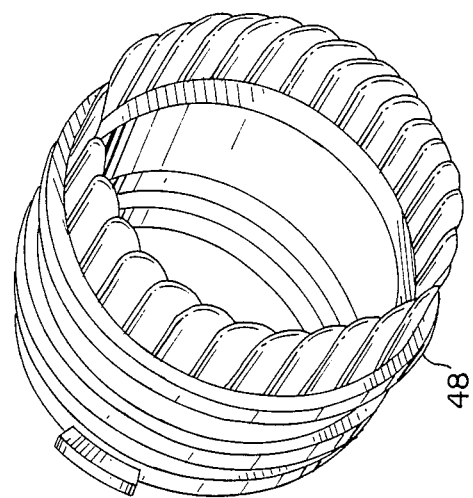
FIG. 16 is an enlarged perspective view of a stator winding.

As shown in FIGS. 8 and 15, each magnetic bearing 50 includes a bearing stator 102, which is secured to an end cover 104 of encoder housing 46, and a bearing rotor 106, which rotates with actuator ring 42. Each bearing stator 102 includes two X-axis and two Y-axis samarium cobalt magnets 108, an inner and an outer annular-shaped control core 110 positioned on each side of the magnets 108, and four control windings 112 wound on each control core 110. The two X-axis magnets 108 and the two Y-axis magnets 108 are each separated by 180 degrees and are magnetically coupled to provide an X-direction bias flux field and a Y-direction bias flux field, respectively. The control windings 112 are spaced at 90 degree intervals around each control core 110, with each winding spanning 60 degrees of the control core. The control windings 112, which are energized by the amplified X-direction and Y-direction displacement measurements, provide either an X-direction or a Y-direction control flux field that is superimposed upon its respective bias flux field for active radial control of bearing rotor 106. With sufficiently large gaps between actuator ring 42 and payload shaft 44, active radial control of the magnetic bearings 50 can also be used to provide vernier pointing control of the payload.

Figure 17:
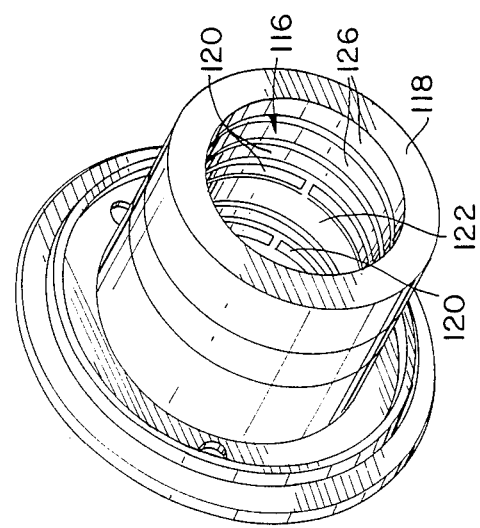
FIG. 17 is an enlarged perspective view of a stationary sensor annulus.

A measurement of the initial angular position $\theta_p$ of payload shaft 44 is provided by the interaction of a left and right conductor element 114 on payload shaft 44 with a stationary left and right sensor element pattern 116, respectively. The initial angular position measurement is used for aligning the phases of the two triangular waveforms, since any alignment error between the insulator elements on the inner and outer annular surfaces of the actuator ring will generate an error in the shaft displacement measurement. As shown in FIGS. 12 and 17, sensor element patterns 116 are located on the inner annular surface of a stationary sensor annulus 118, which is secured to the end cover 104 of encoder housing 46. As shown in FIG. 12, each sensor element pattern 116 includes a left and right set of sensor elements 120 separated by a charge plate 122. Each set of sensor elements 120 includes four rectangular conductor elements spaced around the inner annular surface of the sensor annulus 118 at 180 degree intervals, with each element spanning slightly less than 180 degree of the annular surface. Two of the conductor elements are offset from the other two conductor elements by 90 degrees. The charge plate 122 electrically charges conductor element 114 with another high frequency voltage source to operate sensor elements 120. A left and right pair of slip rings 124 on payload shaft 44 transfer the triangular waveform signals from sensor elements 64 to a left and right pair of slip rings 126 on sensor annulus.

From the foregoing, it will be appreciated that the present invention provides a high-resolution encoder and method for accurately measuring angular position and velocity of rotating shafts. Because of the rotating actuator ring, the encoder provides highly accurate velocity measurements even at low angular velocities. Furthermore, the position and velocity resolutions of the encoder can be easily varied according to the particular static and dynamic requirements of the payload by adjusting the angular velocity of the actuator ring. In addition, the shaft encoder is small, lightweight and low cost.

Although a preferred embodiment of the invention has been shown and described, it will be apparent that other adaptations and modifications can be made without departing from the spirit and scope of the invention. For example, optical or inductive sensor elements can be utilized rather than capacitive sensor elements. In addition, ball bearings can be used rather than magnetic bearings. Accordingly, the invention is not to be limited, except as by the following claims.

I claim:

1. A high-resolution shaft encoder, comprising:
    an annular-shaped actuator ring that rotates at a constant angular velocity with respect to a stationary reference frame;
    means for measuring a time period for the actuator ring to rotate an angular displacement with respect to the stationary reference frame; and
    means for concurrently measuring a time period for the actuator ring to rotate an angular displacement with respect to the shaft reference point;

wherein the time difference between the two time periods multiplied by the angular velocity of the actuator ring is a measure of the angular position of the shaft reference point with respect to the stationary reference frame;

and wherein the angular displacement with respect to the stationary reference frame divided by its respective time period measurement minus the angular displacement with respect to the shaft reference point divided by its respective time period measurement is a measure of the angular velocity of the shaft reference point with respect to the stationary reference frame.

2. The high-resolution shaft encoder as set forth in claim 1, wherein the angular displacement with respect to the stationary reference frame and the angular displacement with respect to the shaft reference point are approximately equal.

3. A high-resolution shaft encoder, comprising:
an encoder housing;
an annular-shaped actuator ring that rotates at a constant angular velocity within the encoder housing;
a shaft centered within the rotating actuator ring;
first sensor means for generating a series of gate pulses, each gate pulse being output by the sensor means as the actuator ring rotates a predetermined angular displacement $\gamma_r$ with respect to the encoder housing;
second sensor means for generating a series of gate pulses, each gate pulse being output by the sensor means as the actuator ring rotates a predetermined angular displacement $\gamma_p$ with respect to the shaft;
means for measuring a time interval $t_r$ between selected gate pulses output by the first sensor means;
means for measuring a time interval $t_p$ between selected gate pulses output by the second sensor means; and
means for measuring a time interval $\Delta t$ between a selected gate pulse output by the first sensor means and a selected gate pulse output by the second sensor means;
wherein the time interval measurement $\Delta t$ multiplied by the predetermined angular displacement $\gamma_r$ divided by the time interval measurement $t_r$ is a measure of the angular position of the shaft with respect to the encoder housing;
and wherein the predetermined angular displacement $\gamma_r$ divided by the time interval measurement $t_r$ minus the predetermined angular displacement $\gamma_p$ divided by the time interval measurement $t_p$ is a measure of the angular velocity of the shaft with respect to the encoder housing.

4. The high-resolution shaft encoder as set forth in claim 3, wherein the predetermined angular displacements $\gamma_r$ and $\gamma_p$ are approximately equal.

5. The high-resolution shaft encoder as set forth in claim 3, wherein the first and second sensor means each includes a plurality of capacitive sensor elements.

6. The high-resolution shaft encoder as set forth in claim 3, and further including a DC motor for rotating the actuator ring at a constant angular velocity.

7. The high-resolution shaft encoder as set forth in claim 6, wherein the DC motor includes the actuator ring as the rotor of the DC motor and a pair of ironless stator windings positioned on either side of the actuator ring.

8. The high-resolution shaft encoder as set forth in claim 3, and further including a pair of magnetic bearings positioned on either side of the actuator ring for magnetically suspending the actuator ring as it rotates.

9. A high-resolution shaft encoder, comprising:
an encoder housing;
an annular-shaped actuator ring that rotates at a constant angular velocity within the encoder housing;
a shaft centered within the rotating actuator ring;
first sensor means for generating a series of gate pulses, each gate pulse being output by the sensor means as the actuator ring rotates a predetermined angular displacement $\gamma_r$ with respect to the encoder housing, the first sensor means including a capacitive sensor element pattern disposed on the inner annular surface of the encoder housing and an insulator element pattern disposed on the outer annular surface of the actuator ring, the actuator ring being electrically charged by a high frequency voltage source;
second sensor means for generating a series of gate pulses, each gate pulse being output by the sensor means as the actuator ring rotates a predetermined angular displacement $\gamma_p$ with respect to the shaft;
means for measuring a time interval $t_r$ between selected gate pulses output by the first sensor means;
means for measuring a time interval $t_p$ between selected gate pulses output by the second sensor means; and
means for measuring a time interval $\Delta t$ between a selected gate pulse output by the first sensor means and a selected gate pulse output by the second sensor means;
wherein the time interval measurement $\Delta t$ multiplied by the predetermined angular displacement $\gamma_r$ divided by the time interval measurement $t_r$ is a measure of the angular position of the shaft with respect to the encoder housing;
and wherein the predetermined angular displacement $\gamma_r$ divided by the time interval measurement $t_r$ minus the predetermined angular displacement $\gamma_p$ divided by the time interval measurement $t_p$ is a measure of the angular velocity of the shaft with respect to the encoder housing.

10. A high-resolution shaft encoder, comprising:
an encoder housing;
an annular-shaped actuator ring that rotates at a constant angular velocity within the encoder housing;
a shaft centered within the rotating actuator ring;
first sensor means for generating a series of gate pulses, each gate pulse being output by the sensor means as the actuator ring rotates a predetermined angular displacement $\gamma_r$ with respect to the encoder housing;
second sensor means for generating a series of gate pulses, each gate pulse being output by the sensor means as the actuator ring rotates a predetermined angular displacement $\gamma_p$ with respect to the shaft, the second sensor means including a capacitive sensor element pattern disposed on the outer surface of the shaft and an insulator element pattern disposed on the inner annular surface of the actuator ring, the actuator ring being electrically charged by a high frequency voltage source;
means for measuring a time interval $t_r$ between selected gate pulses output by the first sensor means;
means for measuring a time interval $t_p$ between selected gate pulses output by the second sensor means; and means for measuring a time interval Δt between a selected gate pulse output by the first sensor means and a selected gate pulse output by the second sensor means;

wherein the time interval measurement Δt multiplied by the predetermined angular displacement $\gamma_r$ divided by the time interval measurement $t_r$ is a measure of the angular position of the shaft with respect to the encoder housing;

and wherein the predetermined angular displacement $\gamma_r$ divided by the time interval measurement $t_r$ minus the predetermined angular displacement $\gamma_p$ divided by the time interval measurement $t_p$ is a measure of the angular velocity of the shaft with respect to the encoder housing.

11. The high-resolution shaft encoder as set forth in claim 9, wherein the capacitive sensor element pattern includes a left and right set of capacitive sensor elements, each set of sensor elements including eight rectangular conductor elements spaced around the inner annular surface of the encoder housing at 45 degree intervals, each element spanning slightly less than 45 degrees of the annular surface.

12. The high-resolution shaft encoder as set forth in claim 11, wherein the insulator element pattern includes a left and right set of insulator elements, each set of insulator elements including four rectangular insulator elements space around the outer annular surface of the actuator ring at 90 degree intervals, each element spanning approximately 45 degrees of the annular surface.

13. The high-resolution shaft encoder as set forth in claim 10, wherein the capacitive sensor element pattern includes a left and right set of capacitive sensor elements, each set of sensor elements including eight rectangular conductor elements spaced around the outer surface of the shaft at 45 degree intervals, each element spanning slightly less than 45 degrees of the surface.

14. The high-resolution shaft encoder as set forth in claim 13, wherein the insulator element pattern includes a left and right set of insulator elements, each set of insulator elements including four rectangular insulator elements spaced around the inner annular surface of the actuator ring at 90 degree intervals, each element spanning approximately 45 degrees of the annular surface.

15. The high-resolution shaft encoder as set forth in claim 12, and further including means for converting the outputs of the capacitive sensor elements into a series of gate pulses.

16. The high-resolution shaft encoder as set forth in claim 14, and further including means for converting the outputs of the capacitive sensor elements into a series of gate pulses.

17. The high-resolution shaft encoder as set forth in claim 3, wherein each means for measuring a time interval includes means for counting a number of clock pulses between the selected gate pulses.

18. The high-resolution shaft encoder as set forth in claim 17, wherein the clock pulses are at a frequency of approximately 10 MHz and the selected gate pulses are separated by at least one revolution of the actuator ring.

19. A high-resolution shaft encoder, comprising:
an encoder housing;
an annular-shaped actuator ring that rotates at a constant angular velocity within the encoder housing;
a shaft centered within the rotating actuator ring;
first sensor means for generating a series of gate pulses, each gate pulse being output by the sensor means as the actuator ring rotates a predetermined angular displacement $\gamma_r$ with respect to the encoder housing;
second sensor means for generating a series of gate pulses, each gate pulse being output by the sensor means as the actuator ring rotates a predetermined angular displacement $\gamma_p$ with respect to the shaft;
means for measuring a time interval $t_r$ between selected gate pulses output by the first sensor means;
means for measuring a time interval $t_p$ between selected gate pulses output by the second sensor means;
means for measuring a time interval Δt between a selected gate pulse output by the first sensor means and a selected gate pulse output by the second sensor means;
a DC motor for rotating the actuator ring at a constant angular velocity, the DC motor including the actuator ring as the rotor of the DC motor and a pair of ironless stator windings positioned on either side of the actuator ring; and
a plurality of sensor elements that generate quadrature sinusoidal commutation signals for energizing the stator windings of the DC motor;
wherein the time interval measurement Δt multiplied by the predetermined angular displacement $\gamma_r$ divided by the time interval measurement $t_r$ is a measure of the angular position of the shaft with respect to the encoder housing;
and wherein the predetermined angular displacement $\gamma_r$ divided by the time interval measurement $t_r$ minus the predetermined angular displacement $\gamma_p$ divided by the time interval measurement $t_p$ is a measure of the angular velocity of the shaft with respect to the encoder housing.

20. The high-resolution shaft encoder as set forth in claim 8, and further including a plurality of proximity sensor elements that measure the relative displacements of the actuator ring for actively controlling the magnetic bearings.

21. The high-resolution shaft encoder as set forth in claim 3, and further including a plurality of sensor elements that measure the initial angular position of the shaft for aligning the phase shift between the two series of gate pulses.

22. The high-resolution shaft encoder as set forth in claim 3, wherein the actuator ring rotates at approximately 4800 rpm.

23. A high-resolution shaft encoder, comprising:
an encoder housing;
an electrically-charged, annular-shaped actuator ring that rotates at a constant angular velocity within the encoder housing;
a shaft centered within the rotating actuator ring;
a capacitive sensor element pattern disposed on the inner annular surface of the encoder housing and an insulator element pattern disposed on the outer annular surface of the actuator ring for generating a first triangular waveform;
a capacitive sensor element pattern disposed on the outer surface of the shaft and an insulator element pattern disposed on the inner annular surface of the actuator ring for generating a second triangular waveform;
means for converting the first and second triangular waveforms into a first and second series of gate pulses;
means for measuring a time interval $t_r$ between selected gate pulses of the first series of gate pulses, the selected gate pulses being separated by one revolution of the actuator ring;

means for measuring a time interval $t_p$ between selected gate pulses of the second series of gate pulses, the selected gate pulses being separated by one revolution of the actuator ring; and means for measuring a time interval $t_{pr}$ between a selected gate pulse of the first series of gate pulses and a selected gate pulse of the second series of gate pulses, the selected gate pulses being separated by at least one revolution of the actuator ring;

wherein the time interval measurement $t_{pr}$ minus the time interval measurement $t_r$ multiplied by $2\pi$ radians and divided by the time interval measurement $t_r$ is a measure of the angular position of the shaft with respect to the encoder housing;

and wherein $2\pi$ radians divided by the time interval measurement $t_r$ minus $2\pi$ radians divided by the time interval measurement $t_p$ is a measure of the angular velocity of the shaft with respect to the encoder housing.

24. The high-resolution shaft encoder as set forth in claim 23, and further including a DC motor for rotating the actuator ring at a constant angular velocity.

25. The high-resolution shaft encoder as set forth in claim 24, wherein the DC motor includes the actuator ring as the rotor of the DC motor and a pair of ironless stator windings positioned on either side of the actuator ring.

26. The high-resolution shaft encoder as set forth in claim 23, and further including a pair of magnetic bearings positioned on either side of the actuator ring for magnetically suspending the actuator ring as it rotates.

27. The high-resolution shaft encoder as set forth in claim 23, wherein each sensor element pattern includes a left and right set of capacitive sensor elements, each set of sensor elements including eight rectangular conductor elements spaced around the surface at 45 degree intervals, each element spanning slightly less than 45 degrees of the surface.

28. The high-resolution shaft encoder as set forth in claim 27, wherein each insulator element pattern includes a left and right set of insulator elements, each set of insulator elements including four rectangular insulator elements spaced around the annular surface at 90 degree intervals, each element spanning approximately 45 degrees of the surface, whereby the interaction of the sensor elements and the rotating insulating elements causes a four-cycle per revolution triangular waveform to be output by each sensor element.

29. The high-resolution shaft encoder as set forth in claim 23, wherein each means for measuring a time interval includes means for counting a number of clock pulses between the selected gate pulses.

30. The high-resolution shaft encoder as set forth in claim 29, wherein the clock pulses are at a frequency of approximately 10 MHz.

31. The high-resolution shaft encoder as set forth in claim 23, wherein the first and second triangular waveforms are four-cycle per revolution triangular waveforms.

32. The high-resolution shaft encoder as set forth in claim 25, and further including a plurality of capacitive sensor elements that generate quadrature sinusoidal commutation signals for energizing the stator windings of the DC motor.

33. The high-resolution shaft encoder as set forth in claim 26, and further including a plurality of proximity sensor elements that measure the relative displacements of the actuator ring for actively controlling the magnetic bearings.

34. The high-resolution shaft encoder as set forth in claim 23, and further including a plurality of capacitive sensor elements that measure the initial angular position of the shaft for aligning the phase shift between the tow triangular waveforms.

35. The high-resolution shaft encoder as set forth in claim 23, wherein the actuator ring rotates at approximately 4800 rpm.

36. A method for measuring angular position and velocity of a rotating shaft, comprising the steps of;

rotating an annular-shaped actuator ring at a constant angular velocity with respect to a stationary reference frame;

measuring a time period for the actuator ring to rotate an angular displacement with respect to the stationary reference frame; and measuring concurrently a time period for the actuator ring to rotate an angular displacement with respect to the shaft reference point;

wherein the time difference between the two time periods multiplied by the angular velocity of the actuator ring is a measure of the angular position of the shaft reference point with respect to the stationary reference frame;

and wherein the angular displacement with respect to the stationary reference frame divided by its respective time period measurement minus the angular displacement with respect to the shaft reference point divided by its respective time period measurement is a measure of the angular velocity of the shaft reference point with respect to the stationary reference frame.

37. The method for measuring as set forth in claim 36, wherein the angular displacement with respect to the stationary reference frame and the angular displacement with respect to the shaft reference point are approximately equal.

38. A method for measuring angular position and velocity of a rotating shaft, comprising the steps of:

rotating an annular-shaped actuator ring at a constant angular velocity with respect to a stationary reference frame;

generating a first series of gate pulses, each gate pulse being generated as the actuator ring rotates a predetermined angular displacement $\gamma_r$ with respect to the stationary reference frame;

generating a second series of gate pulses, each gate pulse being generated as the actuator ring rotates a predetermined angular displacement $\gamma_p$ with respect to the shaft;

measuring a time interval $t_r$ between selected gate pulses of the first series of gate pulses;

measuring a time interval $t_p$ between selected gate pulses of the second series of gate pulses; and measuring a time interval $\Delta t$ between a selected gate pulse of the first series of gate pulses and a selected gate pulse of the second series of gate pulses;

wherein the time interval measurement $\Delta t$ multiplied by the predetermined angular displacement $\gamma_r$ divided by the time interval measurement $t_r$ is a measure of the angular position of the shaft with respect to the reference frame;

and wherein the predetermined angular displacement $\gamma_r$ divided by the time interval measurement $t_r$ minus the predetermined angular displacement $\gamma_p$ divided by the time interval measurement $t_p$ is a measure of the angular velocity of the shaft with respect to the reference frame.

39. The method for measuring as set forth in claim 38, wherein the predetermined angular displacements $\gamma_r$ and $\gamma_p$ are approximately equal.

40. The method for measuring as set forth in claim 38, wherein each step of generating a series of gate pulses includes the steps of:
   generating a triangular waveform; and
   converting the triangular waveform into a series of gate pulses.

41. The method for measuring as set forth in claim 40, wherein the step of generating a triangular waveform includes the step of generating a four-cycle per revolution triangular waveform.

42. The method for measuring as set forth in claim 38, wherein each step of measuring a time interval includes the step of counting a number of clock pulses between the selected gate pulses.

43. The method for measuring as set forth in claim 42, wherein the clock pulses are at a frequency of approximately 10 MHz and the selected gate pulses are separated by at least one revolution of the actuator ring.

44. A method for measuring angular position and velocity of a rotating shaft, comprising the steps of:
   rotating an annular-shaped actuator ring at a constant angular velocity with respect to a stationary reference frame;
   generating a first triangular waveform from capacitive sensor elements as the actuator ring rotates with respect to the stationary reference frame;
   generating a second triangular waveform from capacitive sensor elements as the actuator ring rotates with respect to the shaft;
   converting the first and second triangular waveforms into a first and second series of gate pulses;
   measuring a time interval $t_r$ between selected gate pulses of the first series of gate pulses, the selected gate pulses being separated by one revolution of the actuator ring;
   measuring a time interval $t_p$ between selected gate pulses of the second series of gate pulses, the selected gate pulses being separated by one revolution of the actuator ring; and
   measuring a time interval $t_{pr}$ between a selected gate pulse of the first series of gate pulses and a selected gate pulse of the second series of gate pulses, the selected gate pulses being separated by at least one revolution of the actuator ring;
   wherein the time interval measurement $t_{pr}$ minus the time interval measurement $t_r$ multiplied by $2\pi$ radians and divided by the time interval measurement $t_r$ is a measure of the angular position of the shaft with respect to the encoder housing;
   and wherein $2\pi$ radians divided by the time interval measurement $t_r$ minus $2\pi$ radians divided by the time interval measurement $t_p$ is a measure of the angular velocity of the shaft with respect to the encoder housing.

45. The method for measuring as set forth in claim 44, wherein each step of measuring a time interval includes the step of counting a number of clock pulses between the selected gate pulses.

46. The method for measuring as set forth in claim 45, wherein the clock pulses are at a frequency of approximately 10 MHz.

47. The method for measuring as set forth in claim 44, wherein the first and second triangular waveforms are four-cycle per revolution triangular waveforms.

* * * * *